United States Patent
Budrevich et al.

(10) Patent No.: US 7,759,241 B2
(45) Date of Patent: Jul. 20, 2010

(54) GROUP II ELEMENT ALLOYS FOR PROTECTING METAL INTERCONNECTS

(75) Inventors: Aaron A. Budrevich, Portland, OR (US); Adrien R. Lavoie, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 598 days.

(21) Appl. No.: 11/521,941

(22) Filed: Sep. 15, 2006

(65) Prior Publication Data

US 2008/0070396 A1 Mar. 20, 2008

(51) Int. Cl.
*H01L 21/4763* (2006.01)
(52) U.S. Cl. ............... 438/618; 438/622; 257/E21.627
(58) Field of Classification Search ................ 438/618, 438/622, 623, 643; 257/E21.546, E21.597
See application file for complete search history.

(56) References Cited

U.S. PATENT DOCUMENTS

| 6,165,899 | A | 12/2000 | Matumoto | |
|---|---|---|---|---|
| 6,426,249 | B1 | 7/2002 | Geffken et al. | |
| 7,256,127 | B2 * | 8/2007 | Gallagher et al. | 438/694 |
| 2004/0002211 | A1 | 1/2004 | Young | 438/678 |
| 2004/0053446 | A1 | 3/2004 | Matsubara | |
| 2004/0253806 | A1 * | 12/2004 | Steinlesberger et al. | 438/622 |
| 2005/0130406 | A1 * | 6/2005 | Wolters et al. | 438/627 |
| 2006/0027930 | A1 * | 2/2006 | Edelstein et al. | 257/762 |
| 2006/0069171 | A1 * | 3/2006 | Prokopowicz et al. | 521/61 |
| 2006/0177630 | A1 | 8/2006 | Lee et al. | |
| 2006/0202346 | A1 * | 9/2006 | Shih et al. | 257/774 |

OTHER PUBLICATIONS

International Search Report and Written Opinion from PCT/US2007/078670 mailed Feb. 18, 2008, 10 pgs.
International Preliminary Report on Patentability from PCT/US2007/078670 mailed Mar. 26, 2009, 6 pgs.
Silversmith, Donald J., et al., "Pressure Dependence of the Elastic Constants of Beryllium and Beryllium-Copper Alloys," Physical Review B, Jan. 15, 1970, pp. 567-571, vol. 1, No. 2.
Noguchi, Junji, et al., "Process and Reliability of Air-Gap Cu Interconnect Using 90-nm. Node Technology," IEEE Transactions on Electron Devices, Mar. 2005, pp. 352-359, vol. 52, No. 3.
Chan, Kelvin, et al., "Air-Gap Fabrication Using a Sacrificial Polymeric Thin Film Synthesized via Initiated Chemical Vapor Deposition," Journal of the Electrochemical Society, 2006, pp. C223-C228, vol. 153, No. 4.

* cited by examiner

*Primary Examiner*—Alexander G Ghyka
*Assistant Examiner*—Seahvosh J Nikmanesh
(74) *Attorney, Agent, or Firm*—Blakely, Sokoloff, Taylor & Zafman LLP

(57) ABSTRACT

A plurality of metal interconnects incorporating a Group II element alloy for protecting the metal interconnects and method to form and incorporate the Group II element alloy are described. In one embodiment, a Group II element alloy is used as a seed layer, or a portion thereof, which decreases the line resistance and increases the mechanical strength of a metal interconnect. In another embodiment, a Group II element alloy is used to form a barrier layer, which, in addition to decreasing the line resistance and increasing the mechanical integrity, also increases the chemical integrity of a metal interconnect.

8 Claims, 14 Drawing Sheets

GROUP II ELEMENT ALLOYS FOR PROTECTING METAL INTERCONNECTS

BACKGROUND OF THE INVENTION

1) Field of the Invention

The invention is in the field of Integrated Circuits.

2) Description of Related Art

Metal interconnects are utilized in the fabrication of integrated circuits as a means of connecting various electronic and semiconductor devices into a global circuitry. Two key factors considered when fabricating such metal interconnects are the resistance (R) of each metal interconnect and the coupling capacitance (C), i.e. cross-talk, generated between metal interconnects. Both of these factors hamper the efficiency of metal interconnects. Thus, it has been desirable to reduce both the resistance and the capacitance in metal interconnects in order to mitigate the so called "RC-delay."

For the past decade, the performance of integrated circuits, such as those found on microprocessors, has been greatly enhanced by the incorporation of copper interconnects into the "back-end" of line processing sequence. The presence of such copper interconnects, versus aluminum interconnects, greatly reduces the resistance of such interconnects lending to their improved conduction and efficiency. However, copper interconnects may undergo electro-migration, where copper atoms unfavorably travel away from the metal interconnect and into other regions of the integrated circuit.

Attempts to reduce the coupling capacitance generated between metal interconnects have included the use of low-K dielectric layers (dielectric constant of 2.5-4) that encase the metal interconnects, where K is the dielectric constant of the dielectric layers. However, the incorporation of such films has proven to be challenging. Other attempts to reduce the coupling capacitance between metal interconnects has focused on "air-gap" technologies, where no dielectric layer exists between metal lines. Although this technique has been effective for reducing the coupling capacitance, a result of air having a K-value of only 1, the mechanical and chemical integrity of a plurality of metal interconnects may be compromised in the absence of supporting inter-dielectric layers.

Thus, a method of mitigate the RC-delay in a plurality of metal interconnects is described herein.

DETAILED DESCRIPTION

Figure 1A:
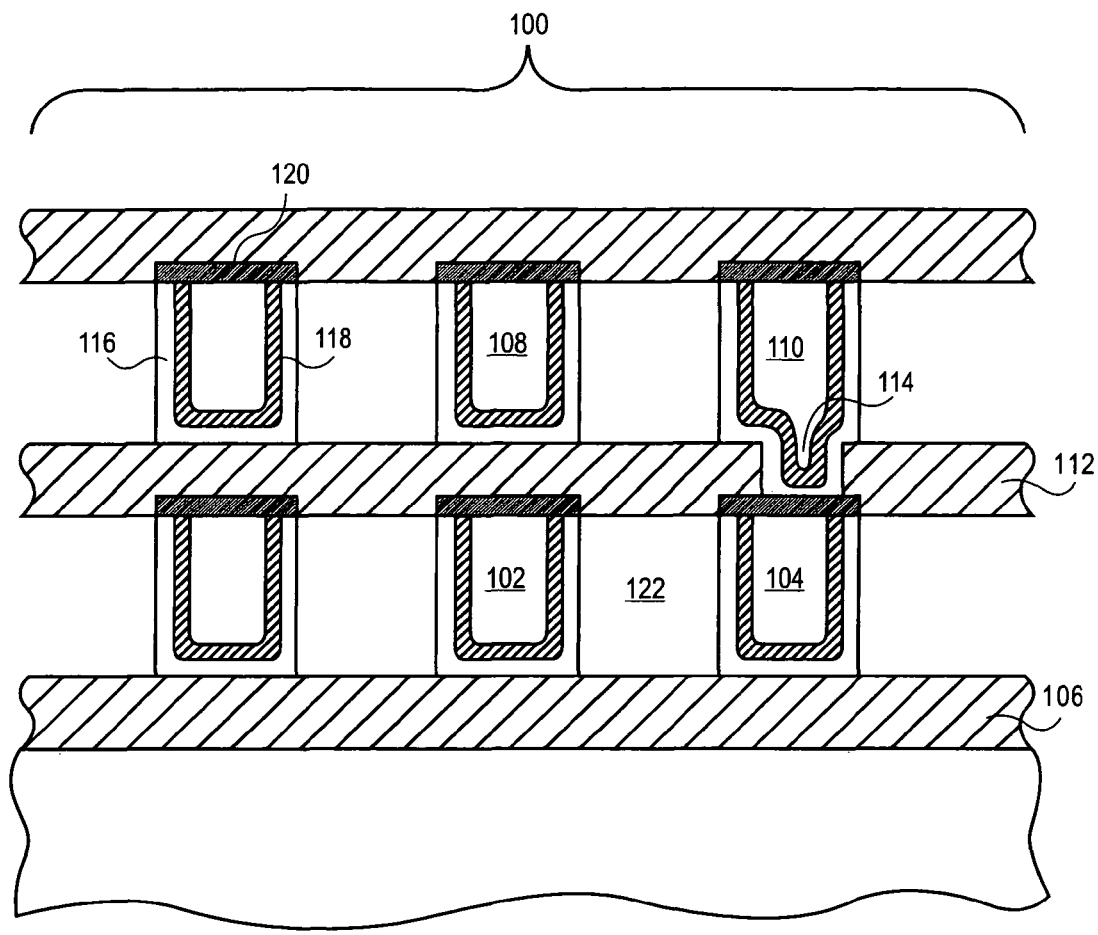
FIGS. 1A-C illustrate cross-sectional views of a plurality of interconnects, in accordance with an embodiment of the present invention.

A plurality of metal interconnects incorporating a Group II element alloy for use in an integrated circuit and processes to fabricate such a plurality of metal interconnects are described. In the following description, numerous specific details are set forth, such as specific dimensions and chemical regimes, in order to provide a thorough understanding of the present invention. It will be apparent to one skilled in the art that the present invention may be practiced without these specific details. In other instances, well-known processing steps, such as patterning steps, are not described in detail, in order to not unnecessarily obscure the present invention. Furthermore, it is understood that the various embodiments shown in the figures are illustrative representations and are not necessarily drawn to scale.

Disclosed herein are a Group II element alloys for protecting metal interconnects and methods to form and incorporate such Group II element alloys. Group II elements are those elements in the second group of the periodic table, i.e. Be, Mg, Ca, Sr, Ba and Ra. The Group II element may be combined with a metal species, such as copper, silver, zinc, cadmium, nickel, palladium or platinum, to form an alloy. A Group II element alloy may be used as a seed layer, or a portion thereof, which decreases line resistance and increases mechanical strength in a metal interconnect. Alternatively, a Group II element alloy may be used to form a barrier layer, which in addition to decreasing line resistance and increasing mechanical integrity, can also enhance the chemical integrity of a metal interconnect. By incorporating a Group II element alloy around a metal interconnect, an air-gap metal interconnect architecture that provides sufficient integrity for incorporation into an integrated circuit may be formed.

A metal interconnect, e.g. a copper interconnect, may be formed by a damascene process, wherein a trench is formed in a dielectric layer and a metal layer is subsequently deposited into the trench. A barrier layer may first be deposited to line the trench and provide a barrier to metallic diffusion from the interconnect. A seed layer is next deposited on the barrier layer prior to deposition of the metal layer. The seed layer enables the filling of the trench with the metal layer, however, the seed layer may ultimately be incorporated into, and thus become indecipherable from, the metal interconnect. Thus, selection of an appropriate seed layer material can be critical in determining the overall performance of the metal interconnect.

A Group II element alloy can be used as a seed layer, or a component of a seed layer, and may impart a decreased line resistance and an increased mechanical integrity to the metal interconnect. For example, the resistivity of a copper-beryllium alloy is approximately 6.8 μOhm·cm, whereas the resistivity of a copper-aluminum alloy is approximately 12.6 μOhm·cm. In accordance with an embodiment of the present invention, copper-beryllium (a copper/Group II element alloy) provides a decreased line resistance for a metal interconnect as compared with copper-aluminum, a commonly used seed layer. An increased mechanical integrity for the metal interconnect may result from the high elastic modulus (ability to accommodate stress and strain) of Group II element alloys, e.g. the elastic modulus of copper-beryllium is approximately 131 GPa, whereas the elastic modulus of copper copper-aluminum is approximately 110 GPa. Thus, in accordance with an embodiment of the present invention, the incorporation of a Group II element alloy into a metal interconnect imparts an increased mechanical integrity to the metal interconnect. In one embodiment, the formation of a robust air gap architecture (i.e. one that can handle stresses and strains) is enabled.

A Group II element alloy can also be used as a barrier layer, and, in addition to imparting a decreased line resistance and an increased mechanical integrity to a metal interconnect, may protect the chemical integrity (control over atomic interactions) of the metal interconnect. As a result of its "hard" nature (i.e. large energy gap between the frontier orbitals), a Group II element does not permit a substantial amount of "soft" (i.e. small energy gap between the frontier orbitals) metal atoms to permeate the Group II element alloy. Thus, in accordance with an embodiment of the present invention, a Group II element alloy is used to inhibit the electro-migration (i.e. mass transfer into other regions of a semiconductor structure) of the metal atoms of a metal interconnect, e.g. the copper atoms of a copper interconnect.

Additionally, a Group II element metal alloy is more amenable to process schemes involving atmospheric conditions. Thus, by including a Group II element metal alloy to surround and protect a metal interconnect, process schemes that may otherwise degrade a metal interconnect can be used. Again, as a result of its "hard" nature, a Group II element reacts favorably and quickly with oxygen atoms to form a very thin passivation layer, e.g. a beryllium oxide passivation layer, at the outer surface of a Group II element metal alloy. For example, in accordance with an embodiment of the present invention, a copper-beryllium alloy will allow oxidation to occur in only the first 2-10 monolayers of the alloy, whereas oxidation of a copper-aluminum alloy can penetrate substantially deeper into the alloy. Thus, as a result of this "self-limiting" barrier to oxidation, the Group II element alloy may be selected to protect metal interconnects under oxidizing conditions. An air-gap process scheme exposes the surfaces of a metal interconnect subsequent to the formation of the metal interconnect. Thus, in accordance with one embodiment of the present invention, an air-gap metal interconnect architecture is enabled by using metal interconnects with surrounding Group II element alloy protecting layers.

A Group II element alloy may be incorporated into an integrated circuit comprised of a plurality of metal interconnects. In accordance with one embodiment of the present invention, an interconnect structure 100 having a plurality of metal interconnects incorporating a Group II element alloy is formed, as shown in FIG. 1A. Metal interconnects 102 and 104 are spaced apart from one another and sit above a dielectric layer 106. Metal interconnects 102 and 104 may comprise any material suitable for conducting a current, such as copper, silver, aluminum or an alloy thereof. In one embodiment, metal interconnects 102 and 104 are comprised of polycrystalline copper with an atomic composition in the range of 97-100% copper atoms. In another embodiment, metal interconnects 102 and 104 comprise an array of interspersed carbon nanotubes.

Dielectric layer 106 may comprise any material suitable to provide structural integrity and isolation to the interconnect structure 100. In an embodiment, dielectric layer 106 does not significantly contribute to cross-talk (capacitive coupling) between metal interconnects 102 and 104. In one embodiment, dielectric layer 106 is comprised of a low- to mid-K dielectric material and the dielectric constant of dielectric layer 106 is in the range of 2-5.5. In another embodiment, the dielectric constant of dielectric layer 106 is in the range of 2.5-4. In an embodiment, dielectric layer 106 is comprised of a material selected from the group consisting of silicon dioxide, a silicate, or a carbon-doped silicon oxide with 0-10% porosity. Referring still to FIG. 1A, metal interconnects 108 and 110 can sit above a second dielectric layer 112, which sits above metal interconnects 102 and 104. As an example of possible features and architectures for the interconnect structure 100, metal interconnect 110 is connected to metal interconnect 104 by a via 114 that is housed by dielectric layer 112.

The metal interconnects 102, 104, 108 and 110 in the interconnect structure 100 comprise a barrier layer 116. Barrier layer 116 may be comprised of any material suitable to inhibit metal diffusion, improve the structural integrity, reduce electromigration and/or to prevent oxidation of the metal interconnects. In one embodiment, barrier layer 116 is comprised of a material selected from the group consisting of tantalum, titanium, tantalum nitride, titanium nitride or a combination thereof. In another embodiment, the thickness of barrier layer 116 is in the range of 25-250 Angstroms.

The metal interconnects 102, 104, 108 and 110 in the interconnect structure 100 also comprise a seed layer 118. Seed layer 118 may be comprised of any material suitable to provide a surface for nucleation in a damascene process. In accordance with an embodiment of the present invention, seed layer 118 is comprised of a metal species and a Group II element. In one embodiment, the Group II element is selected from the group consisting of beryllium, magnesium, strontium or barium and the metal species is selected from the group consisting of copper, silver, zinc, cadmium, nickel, palladium or platinum. In an embodiment, the concentration of the Group II element is in the range of 0.5-2% of the total weight of the seed layer and the metal species is copper. In a specific embodiment, the metal species is copper and the copper is present in seed layer 118 is in the range of 98-99.5% of the total weight of seed layer 118. In one embodiment, seed layer 118 is deposited to a thickness in the range of 50-250 Angstroms. By incorporating a Group II element into seed layer 118, a reduced line resistance for metal interconnects 102, 104, 108 and 110 may be achieved. For example, in accordance with one embodiment of the present invention, the resistivity of a seed layer 118 comprised of a Group II element is in the range of 3-9 μOhm·cm.

The metal interconnects 102, 104, 108 and 110 in the interconnect structure 100 further comprise a capping layer 120. Capping layer 120 may comprise any material suitable to inhibit diffusion, oxidation, and/or electro-migration from the top surface of the metal interconnects and/or to prevent oxidation of the metal interconnects. In one embodiment, capping layer 120 is comprised of a conductive layer selected from the group consisting of iridium, ruthenium, cobalt, a cobalt/tungsten alloy, cobalt/tungsten phosphide, cobalt boron phosphide, cobalt tungsten boron phosphide, silicon nitride, silicon carbide nitride, or a combination thereof.

Referring to FIG. 1A, a gap 122 exists between metal interconnects 102 and 104 and dielectric layers 106 and 112. Gap 122 may be filled with any material or gas suitable to isolate metal interconnects 102 and 104. In a specific embodiment, gap 122 is filled with a material or gas suitable to mitigate cross-talk between metal interconnects 102 and 104. In one embodiment, gap 122 is comprised of air, with a dielectric constant of ~1. In another embodiment, the dielectric constant of gap 122 is in the range of 1-2.5. In a specific embodiment, gap 122 is comprised of a carbon-doped oxide with 25-40% porosity. In an embodiment, the dielectric constant of gap 122 is less than the dielectric constant of dielectric layers 106 and 112. Gap 122 may be of a width sufficient to mitigate cross-talk between neighboring metal interconnects 102 and 104, yet in the case where gap 122 is comprised of air, may be sufficiently narrow to block filling by dielectric layer 112 during the deposition of dielectric layer 112. In one embodiment, the width of gap 122 is in the range of 15-60 nanometers.

Figure 1B:
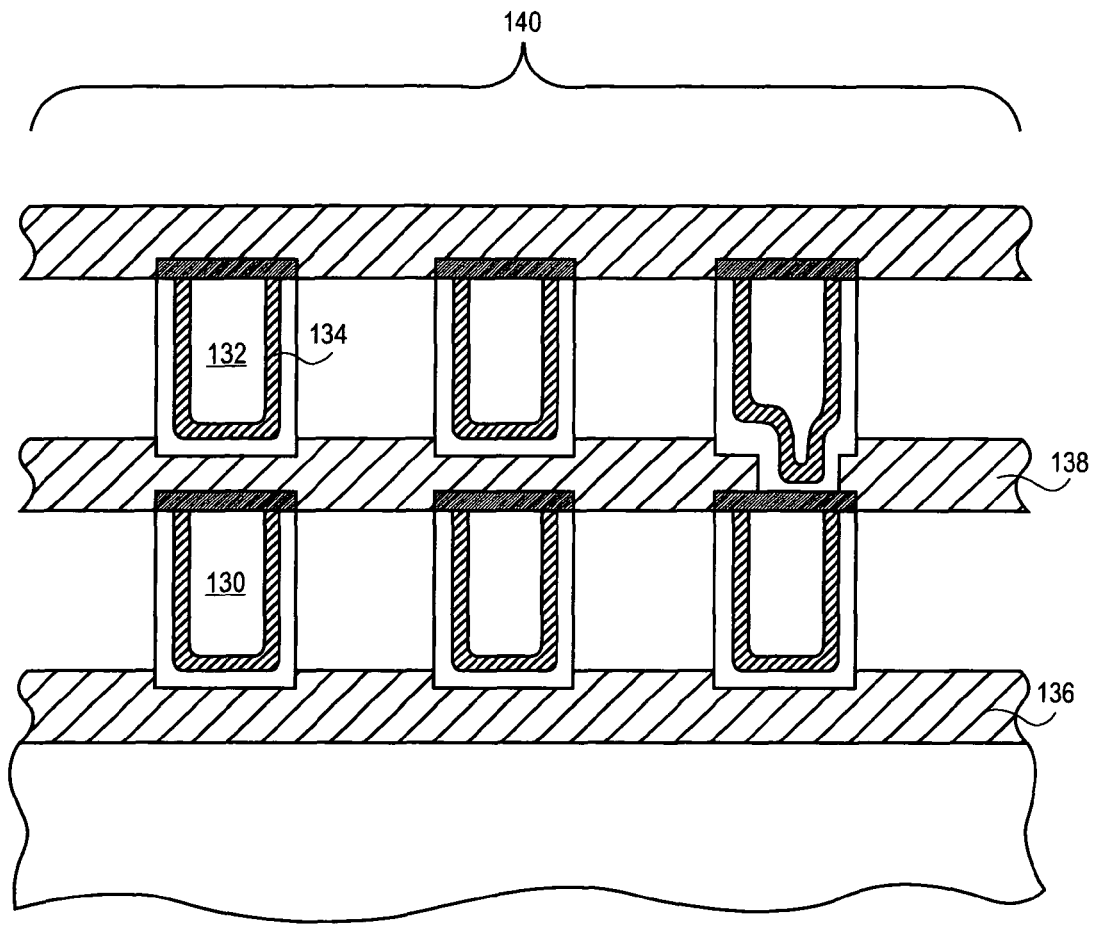

By incorporating a Group II element into seed layer 118, the mechanical integrity of metal interconnects 102, 104, 108 and 110 may be increased. For example, in one embodiment, the elastic modulus of seed layer 18 with a Group II element is in the range of 110-140 GPa. However, a plurality of metal interconnects may require further structural reinforcement. In accordance with an embodiment of the present invention, the metal interconnects are recessed into an underlying dielectric layer, thus "anchoring" the metal interconnects to the dielectric layer. Referring to FIG. 1B, metal interconnects 130 and 132, which comprise a seed layer 134 with a Group II element, are recessed into dielectric layers 136 and 138, respectively. In one embodiment, the plurality of interconnects 140 has an improved structural integrity resulting from the anchoring of metal interconnects 130 and 132. In another embodiment, recessed metal interconnects 130 and 132 are formed by a damascene process, wherein the recessing into dielectric layers 136 and 138 is carried out during the damascene patterning steps.

Figure 1C:
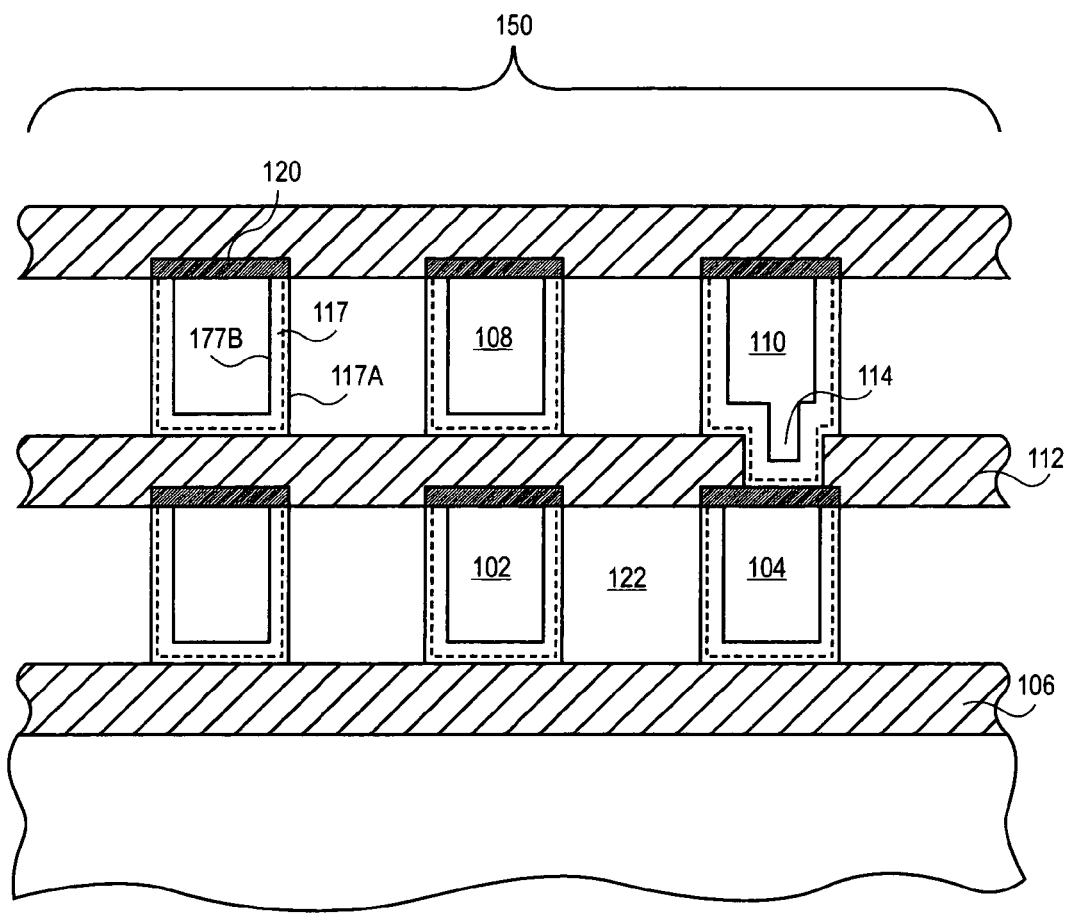

Alternatively, a Group II element alloy may be incorporated into a plurality of metal interconnects in the form of a barrier layer. Referring to FIG. 1C, in accordance with one embodiment of the present invention, an interconnect structure 150 incorporating a Group II element alloy is formed. Metal interconnects 102, 104, 108 and 110, via 114, dielectric layers 106 and 112, capping layer 120 and gap 122 have a functionality and may be formed from the same materials as discussed in association with FIG. 1A. However, in place of barrier layer 116 and seed layer 118 from FIG. 1A, a Group II element alloy barrier layer 117 is incorporated into the interconnect structure 150, as depicted in FIG. 1C.

Group II element alloy barrier layer 117 may be comprised of any Group II element and metal species combination that forms a suitable alloy to inhibit electro-migration and/or surface chemical reactions. In accordance with an embodiment of the present invention, the Group II element is selected from the group consisting of beryllium, magnesium, strontium or barium and the metal species is selected from the group consisting of copper, silver, zinc, cadmium, nickel, palladium or platinum. The Group II element alloy may have a greater concentration of Group II elements at the outer surface 117A of Group II element alloy barrier layer 117, as illustrated by the dashed lines in element 117 of FIG. 1C. For example, in one embodiment, the atomic ratio of Group II atoms at the outer surface 117A of Group II element alloy barrier layer 117 is nearly 1:1 with the metal species and grades down to an atomic ratio in the range of 0.01-0.05:1 at the inner surface 117B of Group II element alloy barrier layer 117. In a specific embodiment, Group II element alloy barrier layer 117 is comprised of copper and a Group II element with an atomic ratio at the outer surface 117A in the range of 0.5-2:1 and an atomic ratio at the inner surface 117B in the range of 1:0.01-0.05. In one embodiment, Group II element alloy barrier layer 117 is deposited to a thickness in the range of 25-250 Angstroms.

In addition to imparting a decreased line resistance and an increased mechanical integrity to the plurality of metal interconnects 150, a Group II element alloy barrier layer 117 can be selected to protect the chemical integrity of the metal interconnects. For example, in accordance with one embodiment of the present invention, by incorporating Group II element metal alloy barrier layer 117 at the surfaces (in particular, the sidewalls and bottom surface) of metal interconnects 102, 104, 108 and 110, a barrier to metal diffusion is formed. Additionally, in accordance with another embodiment of the present invention, metal interconnects 102, 104, 108 and 110 incorporating Group II element alloy barrier layer 117 are more amenable to process schemes that expose the metal interconnects to atmospheric conditions. In the absence of such a Group II element alloy protecting barrier layer, oxygen atoms may penetrate deep into a metal interconnect and reduce the conductivity of the metal interconnect. Thus, a Group II element alloy can be selected to inhibit oxygen from penetrating into a metal interconnect. In one embodiment, the Group II element reacts with oxygen atoms to form a robust, yet very thin passivation layer, thus stopping any oxygen atoms from reaching the metal interconnect. In a specific embodiment, a copper-beryllium alloy barrier layer 117 inhibits oxidation deeper than the first 2-10 monolayers of the copper-beryllium alloy barrier layer 117.

A Group II element alloy may be incorporated into a structure comprising a plurality of metal interconnects by any suitable method that situates the alloy in a desired location around the metal interconnects. In accordance with an embodiment of the present invention, FIGS. 2A-C illustrate cross-sectional views representing preliminary steps in the formation of a plurality of metal interconnects.

Figure 2A:
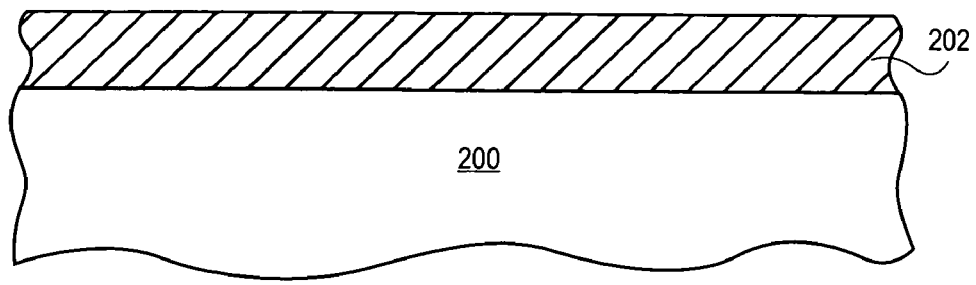
FIGS. 2A-C illustrate cross-sectional views representing preliminary steps in the formation of a plurality of interconnects, in accordance with an embodiment of the present invention.
Figure 2B:
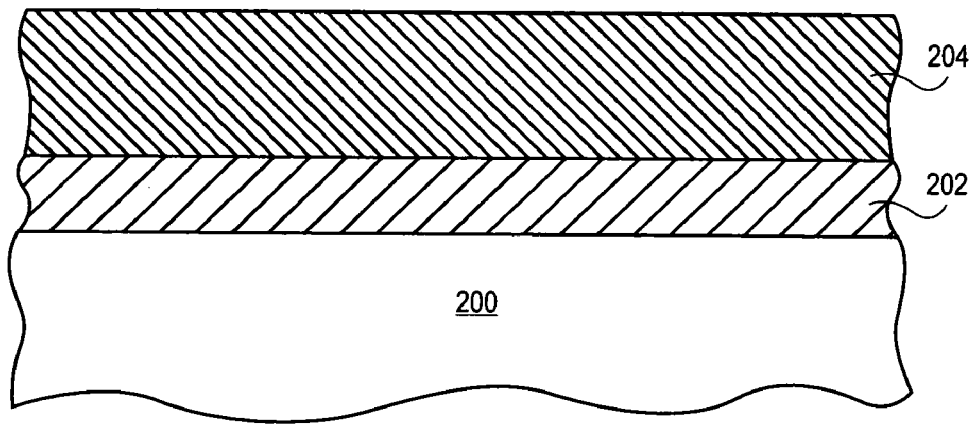
Figure 2C:
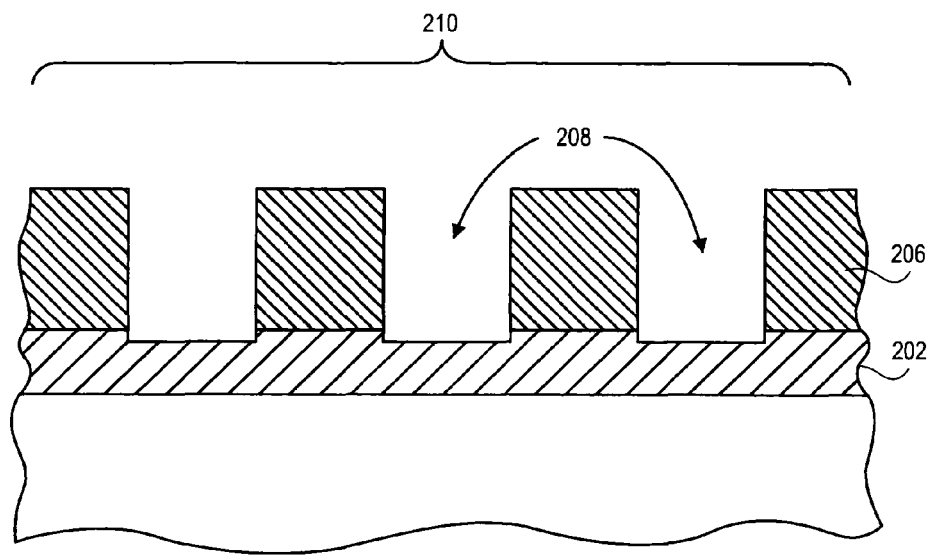

Referring to FIG. 2A, structure 200 is any structure onto which a plurality of metal interconnects is formed. In accordance with an embodiment of the present invention, structure 200 is an array of complimentary metal-oxide-semiconductor (CMOS) transistors fabricated in a silicon substrate and encased in a dielectric layer. A plurality of metal interconnects is formed above the transistors and on the surrounding dielectric layer and are used to electrically connect the transistors, forming an integrated circuit.

A dielectric layer 202 is deposited above structure 200, as depicted in FIG. 2A. Dielectric layer 202 may comprise any material suitable to provide a durable base for a plurality of metal interconnects. In a embodiment, dielectric layer 202 does not significantly contribute to cross-talk between the metal interconnects. In one embodiment, dielectric layer 202 is comprised of a low- to mid-K dielectric material and the dielectric constant of dielectric layer 202 is in the range of 2-5.5. In another embodiment, the dielectric constant of dielectric layer 202 is in the range of 2.5-4. In an embodiment, dielectric layer 202 is comprised of a material selected from the group consisting of silicon dioxide, a silicate, or a carbon-doped silicon oxide with 0-10% porosity. Dielectric layer 202 may be deposited by any suitable technique that provides substantially even coverage of dielectric layer 202 above structure 200, such as a spin-on process, a chemical vapor deposition process, or a polymer-based chemical vapor deposition process. In one embodiment, dielectric layer 202 is deposited by a chemical vapor deposition process involving silane as a precursor gas.

Metal interconnects may be formed above dielectric layer 202 by any technique suitable to provide patterned metal structures. In one embodiment, metal interconnects are formed by a subtractive etch process applied to a blanket metal film. In another embodiment, metal interconnects are formed by a damascene technique. Referring to FIGS. 2B-2C, a damascene technique using a dielectric layer 204 is used to form a plurality of metal interconnects. Dielectric layer 204 may comprise any material suitable for being patterned by a standard lithography/etch process and/or suitable for subsequent removal without impacting dielectric layer 202 or a metal interconnect. In one embodiment, dielectric layer 204 is comprised of a carbon-doped silicon oxide with 20-35% porosity. Dielectric layer 204 may be deposited by any suitable technique that provides substantially even coverage of dielectric layer 204 above dielectric layer 202, as depicted in FIG. 2B. In one embodiment, dielectric layer 204 is deposited by a process selected from the group consisting of a spin-on process, a chemical vapor deposition process, or a polymer-based chemical vapor deposition process.

Referring to FIG. 2C, dielectric layer 204 is patterned to form patterned dielectric layer 206, which exposes portions of the top surface of dielectric layer 202 and forms structure 210. Structure 210 comprises a patterned dielectric layer 206 with a series of trenches 208 formed therein. In one embodiment, the bottoms of the series of trenches 208 are flush with the top surface of dielectric layer 202. In an alternative embodiment, the bottoms of the series of trenches 208 are recessed into dielectric 202, in order to provide an anchoring point for the metal interconnects (as discussed above in association with FIG. 1B), as depicted in FIG. 2C.

Figure 3A:
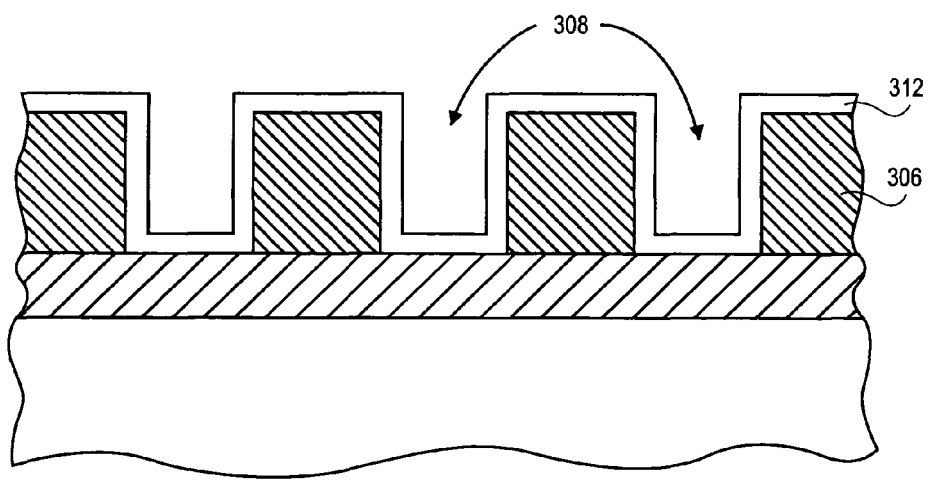
FIGS. 3A-C illustrate cross-sectional views representing preliminary steps in the formation of a plurality of interconnects, in accordance with an embodiment of the present invention.
Figure 3B:
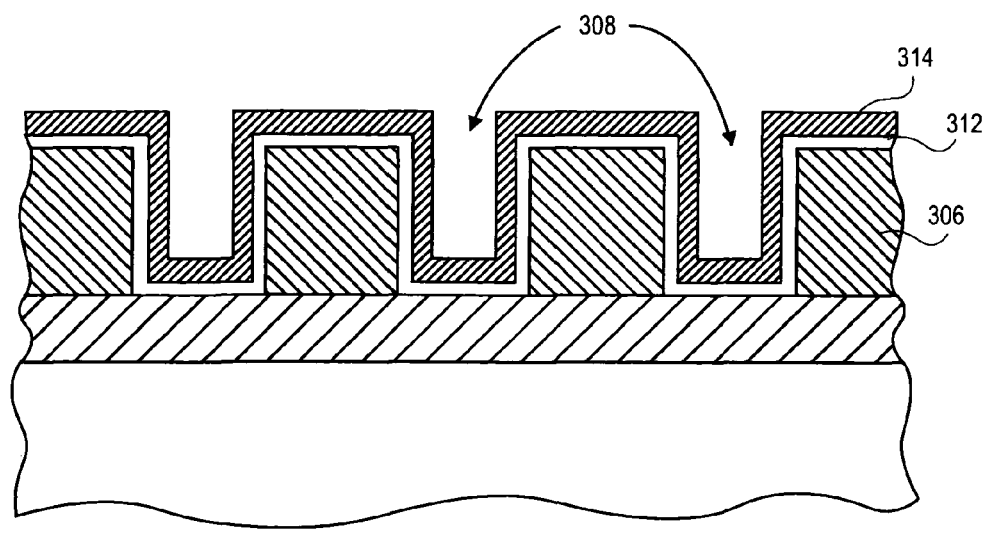
Figure 3C:
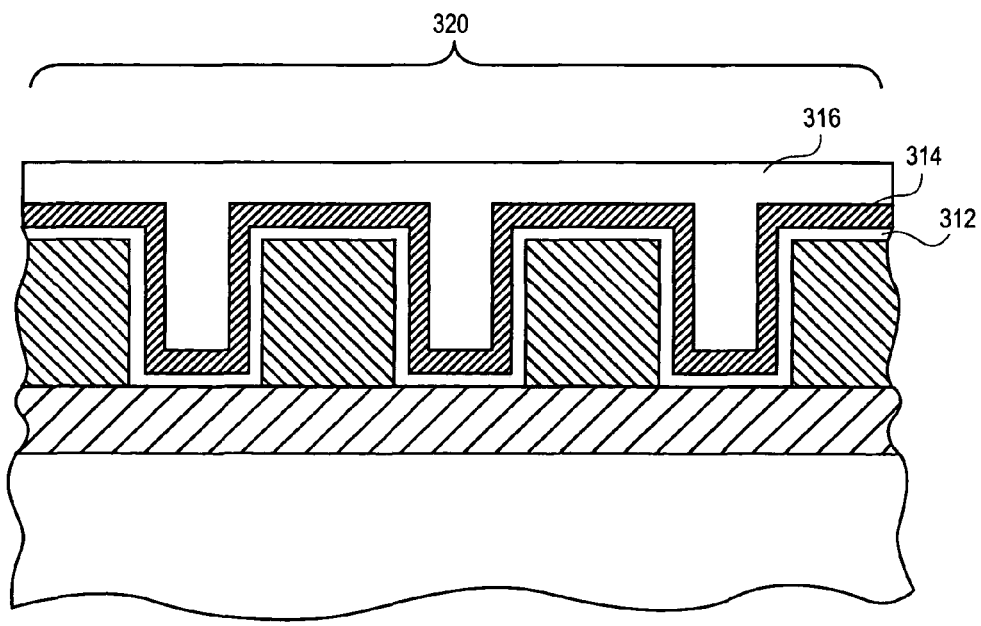

Structure 210 from FIG. 2C may be used as a template for the formation of a plurality of metal interconnects comprising a seed layer with a Group II element alloy. In accordance with an embodiment of the present invention, FIGS. 3A-C illustrate cross-sectional views representing preliminary steps in the formation of a plurality of metal interconnects. For illustrative purposes, the bottoms of the series of trenches are depicted as being flush with the top surface of the underlying dielectric layer. It is to be understood that the series of trenches may be recessed into the underlying dielectric layer in order to provide an anchoring point for the metal interconnects.

Referring to FIG. 3A, a barrier layer 312 is formed on the patterned dielectric layer 306, including adjacent to the sidewalls and above the bottoms of the series of trenches 308. Barrier layer 312 may be comprised of any material and of a sufficient thickness suitable to inhibit out-diffusion of the metal from within the metal interconnects and/or to prevent oxidation of the metal interconnects. In one embodiment, barrier layer 312 is comprised of a material selected from the group consisting of tantalum, titanium, tantalum nitride, titanium nitride or a combination thereof. In another embodiment, the thickness of barrier layer 312 is in the range of 25-250 Angstroms. Barrier layer 312 may be deposited by any suitable technique that evenly lines the sidewalls and bottoms of the trenches 308 formed in patterned dielectric layer 306. In one embodiment, barrier layer 312 is deposited by a process selected from the group consisting of an atomic layer deposition process, a chemical vapor deposition process or a physical vapor deposition process.

Referring to FIG. 3B, a seed layer 314 is formed above barrier layer 312. Seed layer 314 may be comprised of any material suitable to provide a surface for nucleation in a damascene process. In accordance with an embodiment of the present invention, seed layer 314 is comprised of a metal species and a Group II element. In one embodiment, the Group II element is selected from the group consisting of beryllium, magnesium, strontium or barium and the metal species is selected from the group consisting of copper, silver, zinc, cadmium, nickel, palladium or platinum. In an embodiment, the concentration of the Group II element is in the range of 0.5-2% of the total weight of the seed layer and the metal species is copper. In a specific embodiment, the metal species is copper and the copper is present in seed layer 314 in the range of 98-99.5% of the total weight of seed layer 314. Seed layer 314 may be deposited by any suitable technique onto barrier layer 312 in the trenches 308 formed in patterned dielectric layer 306, as depicted in FIG. 3B. In an embodiment, seed layer 314 is formed by a physical vapor deposition process carried out at a temperature in the range of 0-100 degrees Celsius. In one embodiment, seed layer 314 is deposited to a thickness in the range of 25-250 Angstroms.

Referring to FIG. 3C, a metal layer is formed above seed layer 314 to form structure 320. Metal layer 316 may be formed by any process and from any conductive material suitable for completely (or mostly, if a void is inadvertently formed) filling the series of trenches 308. In an embodiment, metal layer 316 is comprised of a material selected from the group consisting of copper, silver, aluminum or an alloy thereof. In one embodiment, metal layer 316 is comprised of polycrystalline copper with an atomic composition in the range of 97-100% copper atoms. In an embodiment, metal layer 316 is deposited by a technique selected from the group comprising an electro-chemical deposition process, an electro-less deposition process, chemical vapor deposition, atomic layer deposition (ALD) process or a reflow process.

Structure 320 may be used to form a plurality of metal interconnects comprising a seed layer with a Group II element alloy. In accordance with an embodiment of the present invention, FIGS. 4A-B illustrate cross-sectional views representing the formation of a plurality of metal interconnects.

Figure 4A:
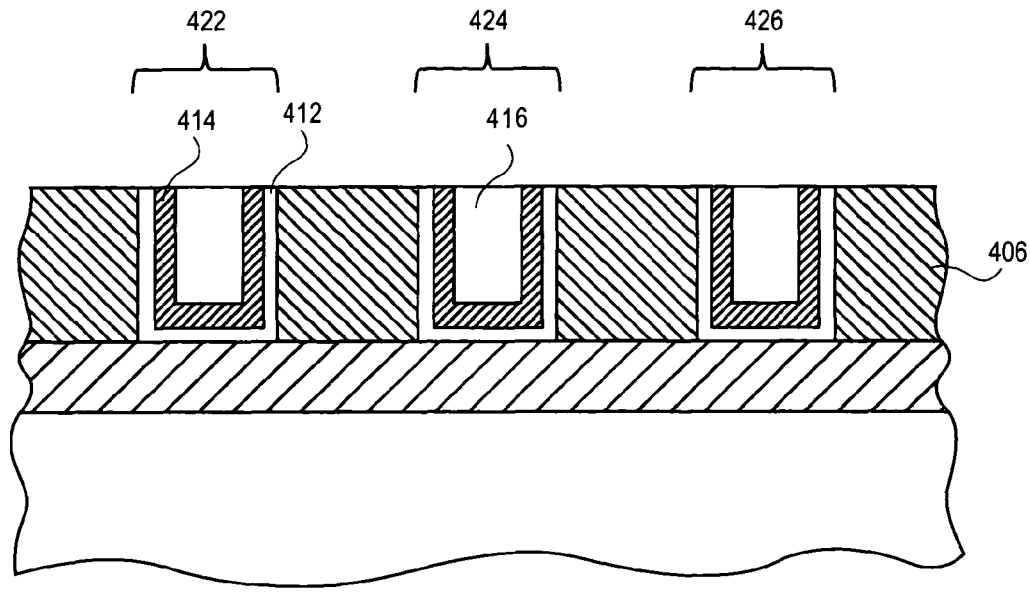
FIGS. 4A-B illustrate cross-sectional views representing the formation of a plurality of interconnects, in accordance with an embodiment of the present invention.

Referring to FIG. 4A, the portions of barrier layer 412, seed layer 414 and metal layer 416 that reside on the top surfaces of patterned dielectric layer 406 are removed to form metal interconnects 422, 424 and 426. The portions of barrier layer 412, seed layer 414 and metal layer 416 that reside on the top surfaces of patterned dielectric layer 406 may be removed by any technique suitable to form a top surface of metal interconnects 422, 424 and 426 that is (or is nearly) flush with the top surfaces of patterned dielectric layer 406 without substantially degrading dielectric layer 406 or dishing metal interconnects 422, 424 or 426. In accordance with an embodiment of the present invention, a chemical-mechanical polish step is utilized to planarize/remove undesirable portions of the metal layers and form metal interconnects 422, 424 or 426.

Figure 4B:
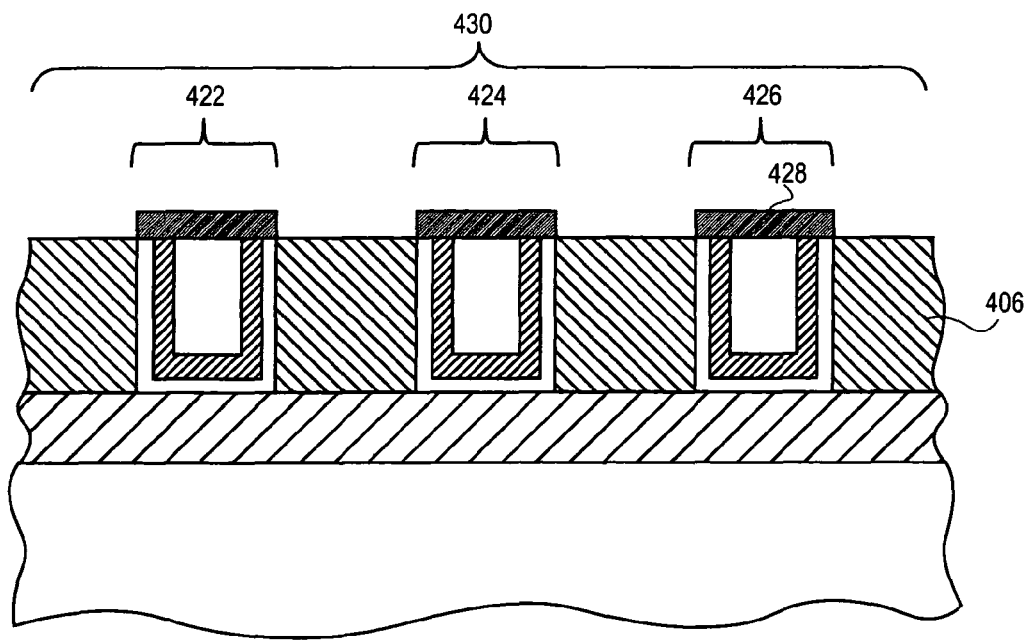

Referring to FIG. 4B, a capping layer 428 is formed on the top surface of metal interconnects 422, 424 or 426 to form structure 430. Capping layer 428 may be comprised of any material suitable to prevent metal line extrusion or metal line out-diffusion, and may have benefits for inhibiting electromigration from metal interconnects 422, 424 and 426 and/or to prevent oxidation of the top surfaces of metal interconnects 422, 424 and 426. In one embodiment, capping layer 428 is comprised of a conductive layer selected from the group consisting of iridium, ruthenium, cobalt, a cobalt/tungsten alloy, cobalt/tungsten phosphide, cobalt tungsten boron phosphide, cobalt boron phosphide or a combination thereof. Capping layer 428 may be formed by any process suitable for uniformly covering the top surfaces of metal interconnects 422, 424 and 426, but not covering the top surfaces of patterned dielectric layer 406. In one embodiment, capping layer 428 is deposited by a technique selected from the group comprising an electro-chemical deposition process, an electro-less deposition process, or an atomic layer deposition (ALD) process.

Structure 430 may be used to form a plurality of metal interconnects comprising a seed layer with a Group II element alloy, wherein the patterned dielectric layer 406 is retained in the final structure. In accordance with an embodiment of the present invention, FIG. 5 illustrates a cross-sectional view of a plurality of interconnects.

Figure 5:
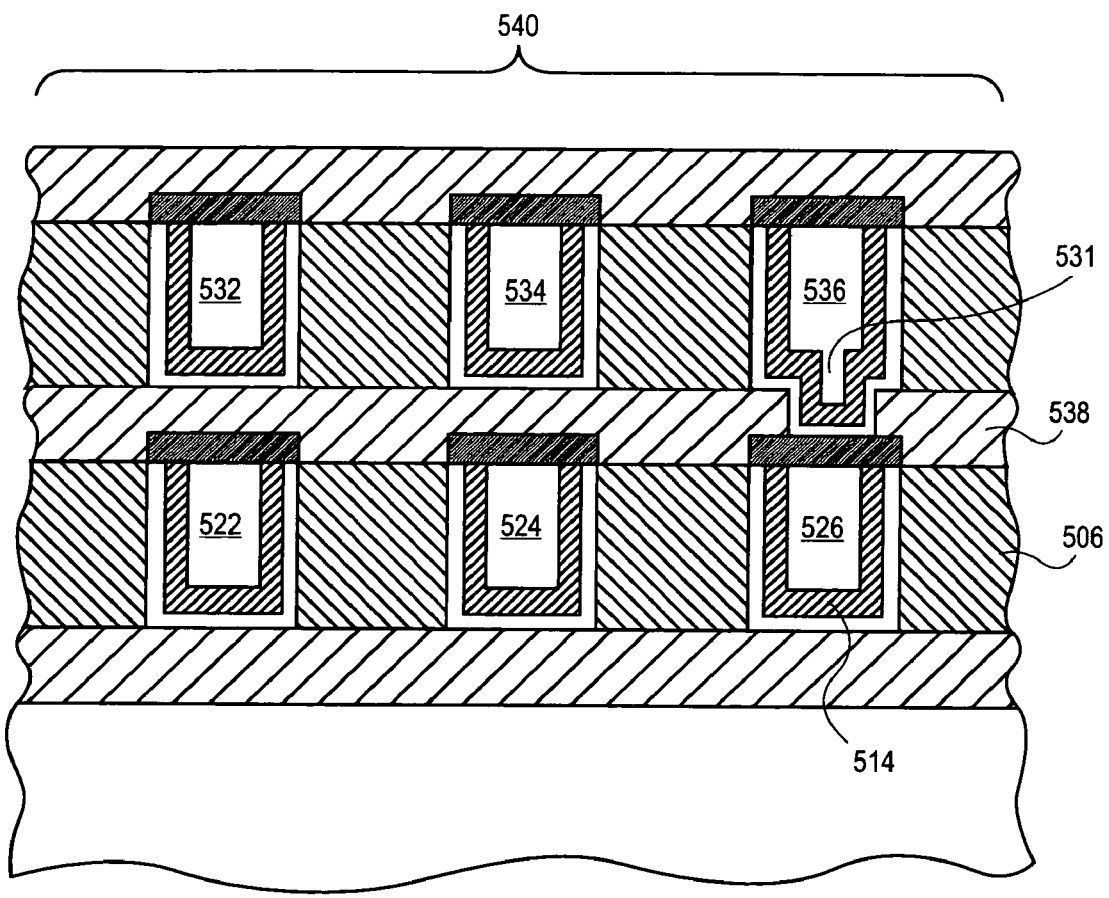
FIG. 5 illustrates a cross-sectional view of a plurality of interconnects, in accordance with an embodiment of the present invention.

Referring to FIG. 5, an interconnect structure 540 comprising a plurality of metal interconnects is formed by repeating the process steps utilized to fabricate metal interconnects 422, 424 and 426, described above. In accordance with an embodiment of the present invention, patterned dielectric layer 506 is retained to act as an inter-dielectric layer between metal interconnects 522, 524 and 526. The first level of metal interconnects 522, 524 and 526 is covered by a dielectric layer 538 and a second level of metal interconnects 532, 534 and 536 is then formed above dielectric layer 538. Dielectric layer 538 may be formed from the same material, or selected from the same group of materials, as is used to form dielectric layer 202, described in association with FIG. 2A. As an example of possible features and architectures for the interconnect structure 540, metal interconnect 536 is connected to metal interconnect 526 by a via 531 that is encased by dielectric layer 538. By incorporating a Group II element into seed layer 514, a reduced line resistance for metal interconnects 522, 524, 526, 532, 534 and 536 may be achieved. For example, in accordance with one embodiment of the present invention, the resistivity of a seed layer 514 comprised of a Group II element is in the range of 3-9 µOhm·cm.

Alternatively, structure 430 may be used to form a plurality of metal interconnects comprising a seed layer with a Group II element alloy, wherein the patterned dielectric layer 406 is removed from the final structure. In accordance with an embodiment of the present invention, FIGS. 6A-B illustrate cross-sectional views representing the formation of a plurality of interconnects.

Figure 6A:
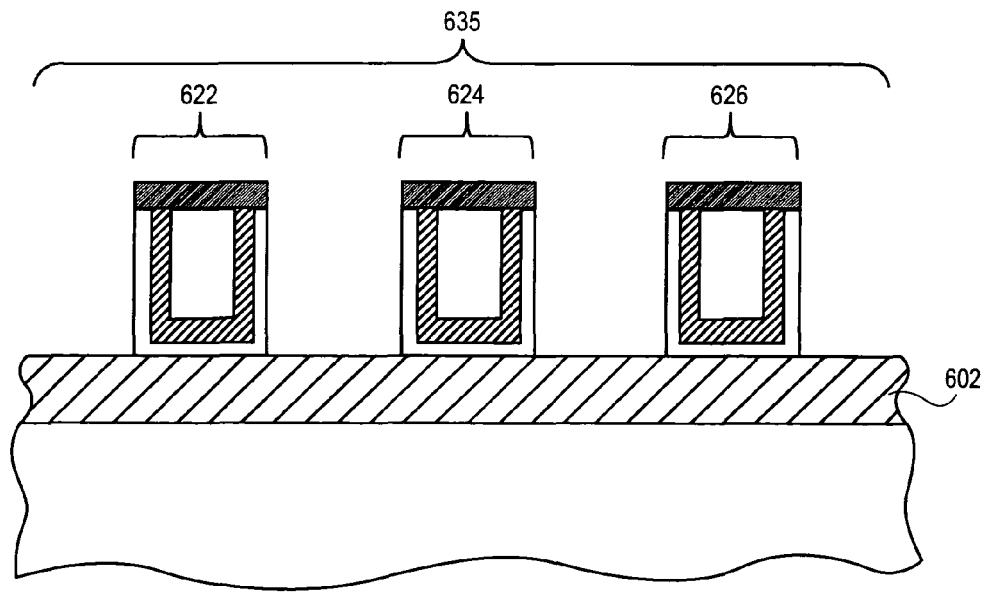
FIGS. 6A-B illustrate cross-sectional views representing the formation of a plurality of interconnects, in accordance with an embodiment of the present invention.

Referring to FIG. 6A, patterned dielectric layer 406 may be removed to provide free-standing metal interconnects 622, 624 and 626 in structure 635. Patterned dielectric layer 406 may be removed by any technique suitable to completely remove patterned layer 406 without impacting dielectric layer 602 or metal interconnects 622, 624 or 626. In accordance with an embodiment of the present invention, patterned dielectric layer 406 is comprised of a carbon-doped silicon oxide with 20-35% porosity, dielectric layer 602 is comprised of a carbon-doped silicon oxide with 0-10% porosity, and patterned dielectric layer 406 is removed with a wet etch process step. In one embodiment, patterned dielectric layer 406 is removed with a wet etch process step comprising applying an aqueous solution with a concentration of tetramethylammonium hydroxide in the range of 15-30% by volume at a temperature in the range of 45-70 degrees Celsius for a duration in the range of 15-45 minutes.

Figure 6B:
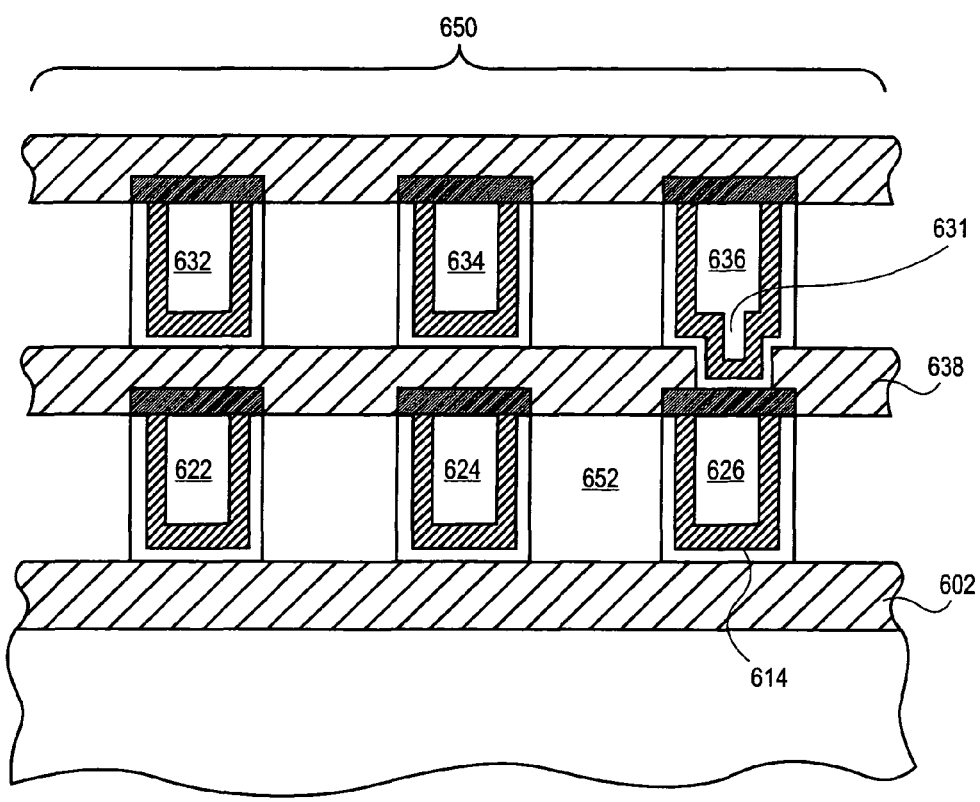

Referring to FIG. 6B, an interconnect structure 650 comprising a plurality of metal interconnects is formed by repeating the process steps utilized to fabricate metal interconnects 622, 624 and 626, described above. In accordance with an embodiment of the present invention, patterned dielectric layer 406 is removed. The first level of metal interconnects 622, 624 and 626 is covered by a dielectric layer 638 and a second level of metal interconnects 632, 634 and 636 is then formed above dielectric layer 638. Thus, the regions between metal interconnects 622, 624 and 626 and dielectric layers 602 and 638 defines a series of gaps 652. As an example of possible features and architectures for the interconnect structure 650, metal interconnect 636 is connected to metal interconnect 626 by a via 631 that is encased by dielectric layer 638.

Dielectric layer 638 may be deposited by any suitable technique that provides substantially even coverage above metal interconnects 622, 624 and 626 without substantially filling the series of gaps 652, as depicted in FIG. 6B. In one embodiment, dielectric layer 638 is deposited by a process selected from the group consisting of a spin-on process, a physical vapor deposition process, a chemical vapor deposition process, or a polymer-based chemical vapor deposition process. Dielectric layer 638 may comprise any material suitable to provide a durable base for a new level of metal interconnects 632, 634, and 636. In one embodiment, dielectric layer 638 is comprised of a material selected from the group consisting of silicon dioxide, a silicate, or a carbon-doped silicon oxide with 0-10% porosity. By incorporating a Group II element into seed layer 614, a reduced line resistance for metal interconnects 622, 624, 626, 632, 634 and 636 may be achieved.

The series of gaps 652 may be filled with any material or gas suitable to mitigate cross-talk between metal interconnects 622, 624, 626, 632, 634 and 636. In one embodiment, the series of gaps 652 is comprised of air, with a dielectric constant of ~1, as depicted in FIG. 6A. Each gap in the series of gaps 652 should be of a width sufficient to mitigate cross-talk between neighboring metal interconnects 622, 624, 626, 632, 634 and 636, yet in the case where the series of gaps 652 is comprised of air, should be sufficiently narrow to block filling by dielectric layer 638. In one embodiment, the width of each gap is in the range of 15-60 nanometers. In an alternative embodiment, structure 635 is used to form a plurality of metal interconnects comprising a seed layer with a Group II element alloy, wherein the series of gaps 652 is filled with a new dielectric material that adds mechanical reinforcement to the interconnect structure 650. In accordance with an embodiment of the present invention, FIGS. 7A-B illustrate cross-sectional views representing the formation of a plurality of interconnects.

Figure 7A:
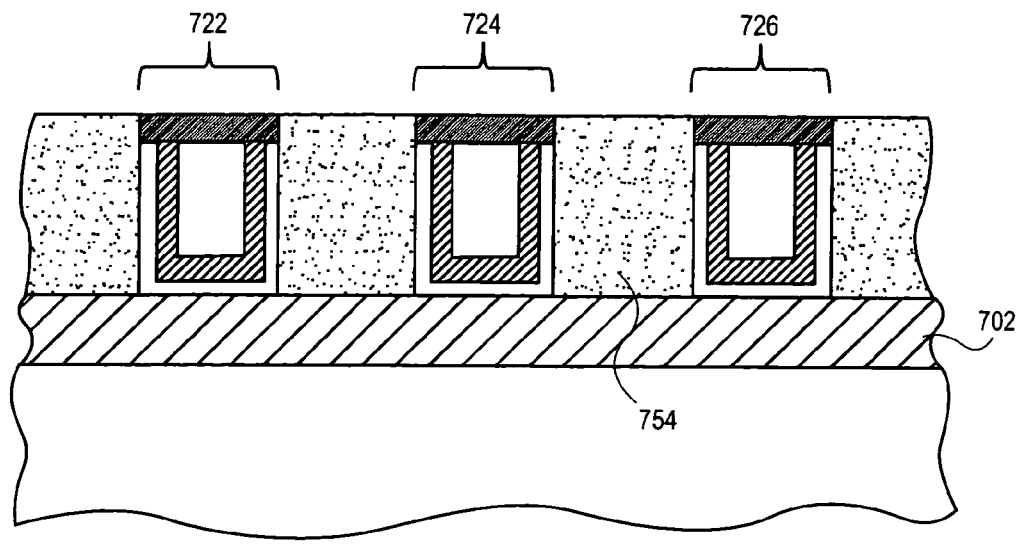
FIGS. 7A-B illustrate cross-sectional views representing the formation of a plurality of interconnects, in accordance with an embodiment of the present invention.

Referring to FIG. 7A, the series of gaps 652 is filled with a dielectric layer 754. Dielectric layer 754 may be formed from any material suitable to mitigate cross-talk between metal interconnects 722, 724 and 726. In one embodiment, the dielectric constant of dielectric layer 754 is in the range of 1-2.5. In a specific embodiment, dielectric layer 754 is comprised of a carbon-doped oxide with 25-40% porosity. In an embodiment, the dielectric constant of dielectric layer 754 is less than the dielectric constant of dielectric layer 702. Dielectric layer 754 may be deposited by any technique suitable to substantially fill the series of gaps 652, as depicted in FIG. 7A. In an embodiment, dielectric layer 754 is deposited by chemical vapor deposition process. In one embodiment, dielectric layer 754 is deposited by a process selected from the group consisting of a plasma-enhanced chemical vapor deposition process or by a polymer-based chemical vapor deposition process.

Figure 7B:
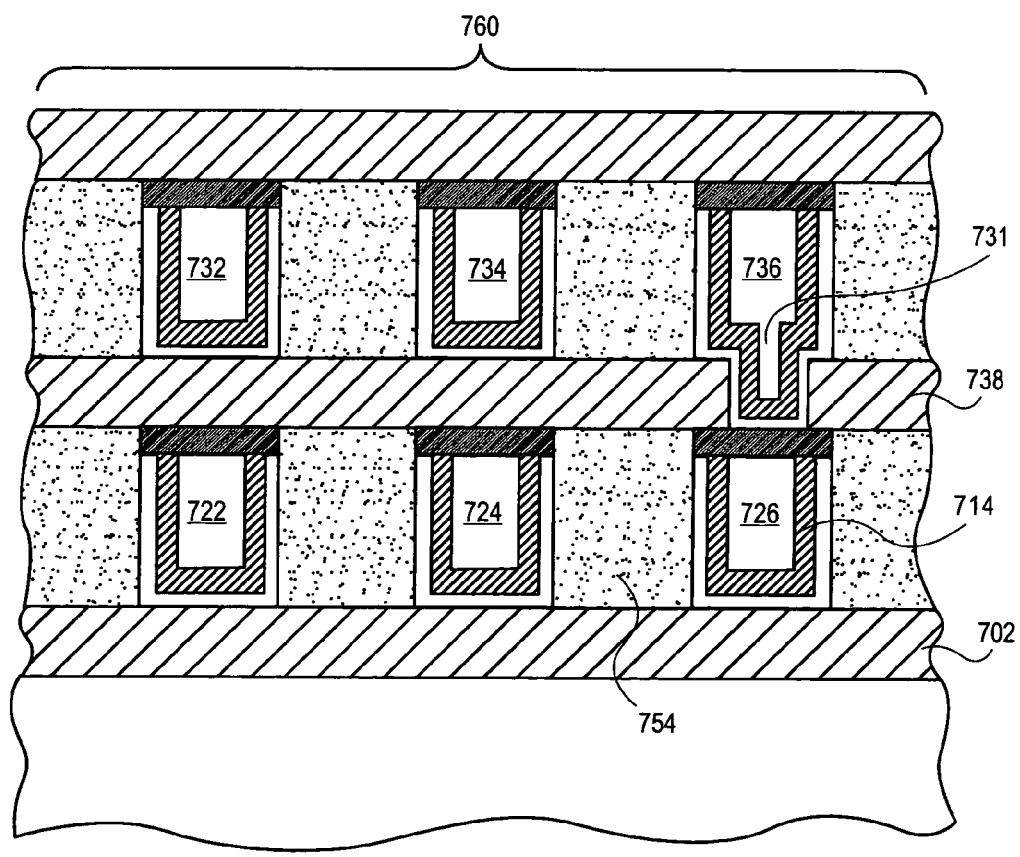

Referring to FIG. 7B, a plurality of metal interconnects 760 is formed by repeating the process steps utilized to fabricate metal interconnects 722, 724 and 726, described above. In accordance with an embodiment of the present invention, the series of gaps 652 is filled with dielectric layer 754. The first level of metal interconnects 722, 724 and 726 is covered by a dielectric layer 738 and a second level of metal interconnects 732, 734 and 736 is then formed above dielectric layer 738. Thus, the regions between metal interconnects 722, 724 and 726 and dielectric layers 702 and 738 comprise an ultra-low-K dielectric material, as depicted in FIG. 7B. As an example of possible features and architectures for the interconnect structure 760, metal interconnect 736 is connected to metal interconnect 726 by a via 731 that is encased by dielectric layer 738. By incorporating a Group II element into seed layer 714, a reduced line resistance for metal interconnects 722, 724, 726, 732, 734 and 736 may be achieved.

In an alternative embodiment, structure 635 is used to form a plurality of metal interconnects comprising a seed layer with a Group II element alloy, wherein dielectric spacers are formed adjacent to the sidewalls of the metal interconnects in order to provide reinforcement to the interconnect structure 650. In accordance with an embodiment of the present invention, FIGS. 8A-C illustrate cross-sectional views representing the formation of a plurality of interconnects.

Figure 8A:
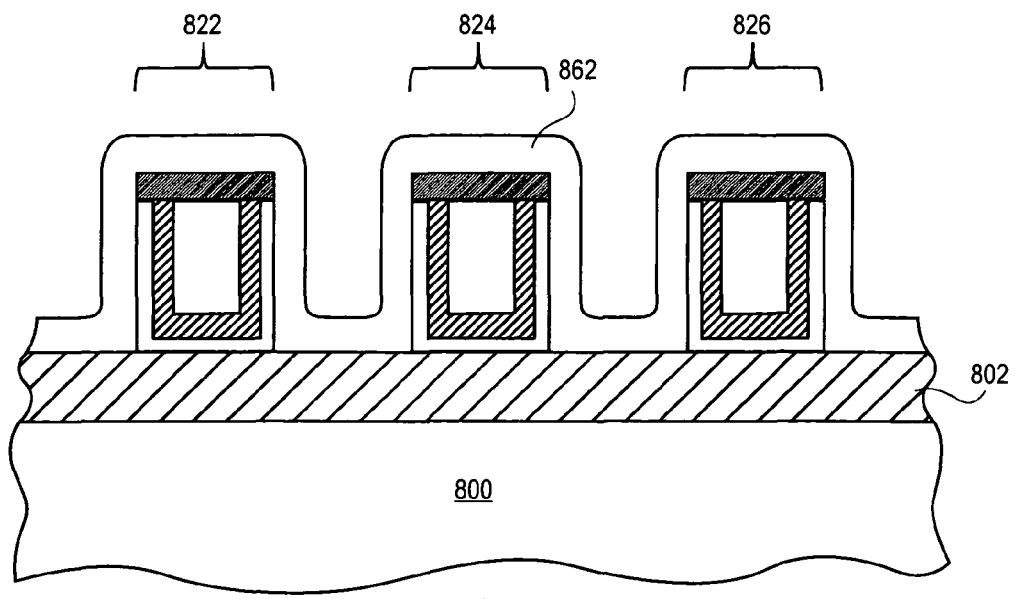
FIGS. 8A-C illustrate cross-sectional views representing the formation of a plurality of interconnects, in accordance with an embodiment of the present invention.

Referring to FIG. 8A, a spacer-forming dielectric layer 862 is deposited conformal to metal interconnects 822, 824 and 826 and above the exposed surfaces of dielectric layer 802. Spacer-forming dielectric layer 862 may be deposited by any suitable technique that renders a conformal or near conformal layer. Also, spacer-forming dielectric layer 862 should be deposited by any suitable technique that does not over-heat any electronic or semiconductor devices that may reside in structure 800. In one embodiment, spacer-forming dielectric layer 862 is deposited at or below a temperature of 400° C. In another embodiment, spacer-forming dielectric layer 862 is deposited by a technique selected from the group consisting of atomic layer deposition or by chemical vapor deposition. Spacer-forming dielectric layer 862 may be formed from any material suitable to mitigate cross-talk between metal interconnects 822, 824 and 826 while adding structural support to the plurality of metal interconnects. In one embodiment, spacer-forming dielectric layer 862 is comprised of a material selected from the group consisting of silicon nitride, silicon carbide, nitrogen-doped silicon carbide, oxygen-doped silicon carbide, boron-doped carbon nitride or boron-doped silicon carbide. In another embodiment, spacer-forming dielectric layer 862 is comprised of a boron-doped carbon nitride layer, wherein said boron-doped carbon nitride layer is formed by reacting the gases methane, diborane, and ammonia. In one embodiment, the thickness of spacer-forming dielectric layer 862 determines the width of dielectric spacers 864, described below.

Figure 8B:
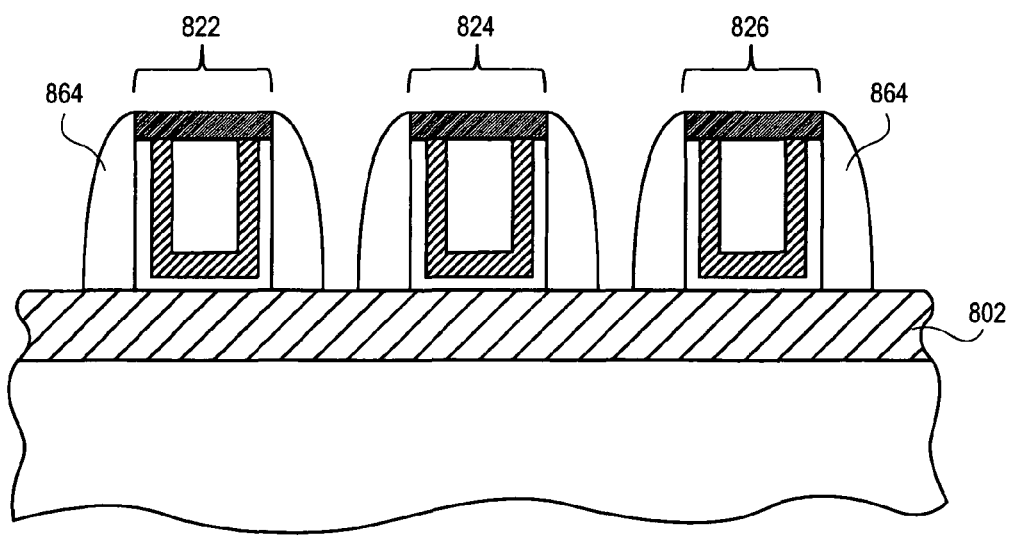

Spacer-forming dielectric layer 862 may be patterned to form discontiguous dielectric spacers 864, as depicted in FIG. 8B. Spacer-forming dielectric layer 862 may be patterned by any suitable technique that removes the portions of spacer-forming dielectric layer 862 from the top surfaces of metal interconnects 822, 824 and 826 and from the top surfaces of dielectric layer 802 that are exposed between metal interconnects 822, 824 and 826. Thus, the portions of spacer-forming dielectric layer 862 that are adjacent to the sidewalls of metal interconnects 822, 824 and 826 are retained to form discontiguous dielectric spacers 864. In one embodiment, spacer-forming dielectric layer 862 is patterned to form dielectric spacers 864 by using an anisotropic etch process. In another embodiment, spacer-forming dielectric layer 864 is patterned to form dielectric spacers 864 by using a vertical dry or plasma etch process comprising fluorocarbons of the general formula $C_xF_y$, where x and y are natural numbers. In another embodiment, spacer-forming dielectric layer 862 is patterned to form dielectric spacers 864 by using a vertical dry or plasma etch process comprising free radical fluorocarbons. In one embodiment, the width of dielectric spacers 864 is determined by the thickness of spacer-forming dielectric layer 862. In another embodiment, the anisotropic etch process is extended to remove a portion of dielectric layer 802.

Figure 8C:
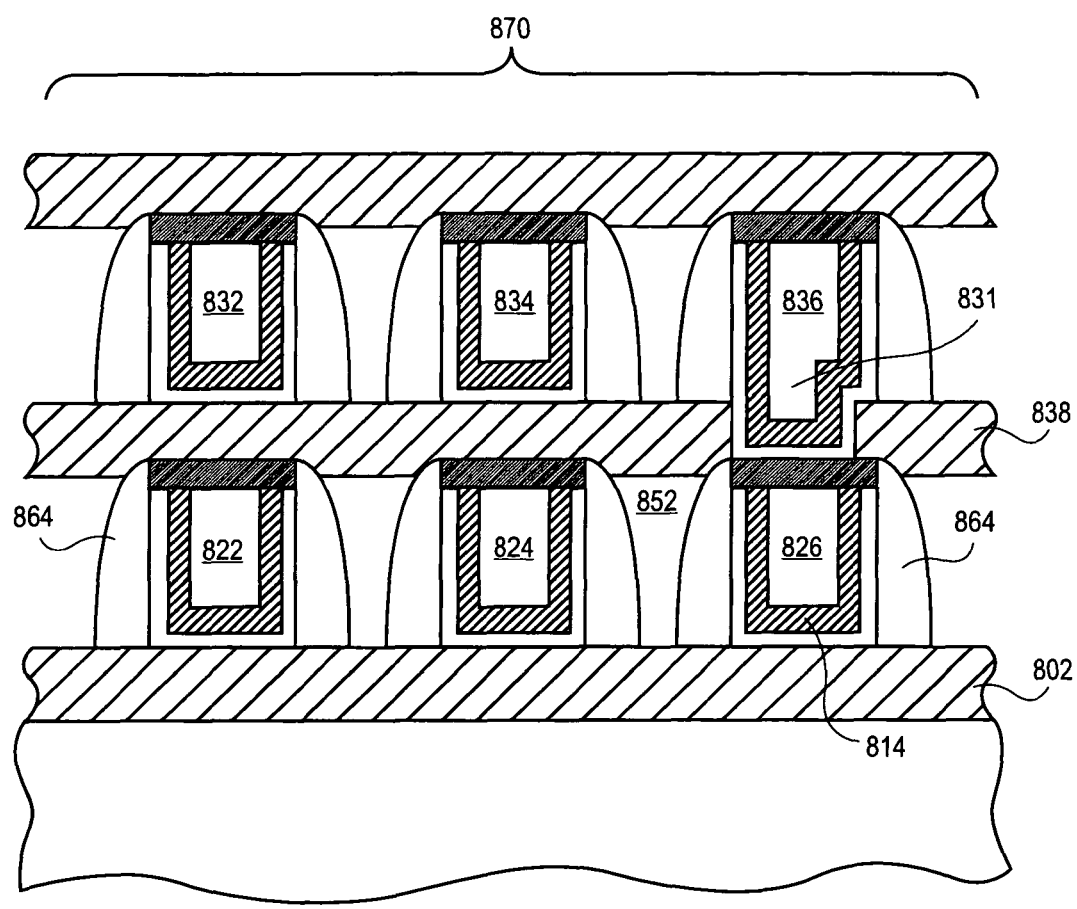

Referring to FIG. 8C, an interconnect structure 870 is formed by repeating the process steps utilized to fabricate metal interconnects 822, 824 and 826, described above. In accordance with an embodiment of the present invention, dielectric spacers 864 are formed adjacent the metal interconnects 822, 824 and 826. The first level of metal interconnects 822, 824 and 826 is covered by a dielectric layer 838 and a second level of metal interconnects 832, 834 and 836 is then formed above dielectric layer 838. Thus, the regions between dielectric spacers 864 (adjacent to the sidewalls of metal interconnects 822, 824 and 826) and dielectric layers 802 and 838 defines a series of gaps 852. In one embodiment, the series of gaps 852 is comprised of air, with a dielectric constant of ~1. In another embodiment, the dielectric constant of the series of gaps is in the range of 1-2.5. In a specific embodiment, the series of gaps 852 is comprised of a carbon-doped oxide with 25-40% porosity. In an embodiment, the dielectric constant of the series of gaps 852 is ultra low-K and is less than the dielectric constant of dielectric layers 802 and 838.

As an example of possible features and architectures for interconnect structure 870, metal interconnect 836 is connected to metal interconnect 826 by a via 831 that is encased by dielectric layer 838. In accordance with an embodiment of the present invention, dielectric spacers 864 provide a region upon which un-landed vias may "land". By incorporating a Group II element into seed layer 814, a reduced line resistance for metal interconnects 822, 824, 826, 832, 834 and 836 may be achieved.

Alternatively, structure 210 from FIG. 2C may be used as a template for the formation of a plurality of metal interconnects comprising a barrier layer with a Group II element alloy. In accordance with an embodiment of the present invention, FIGS. 9A-C illustrate cross-sectional views representing preliminary steps in the formation of a plurality of metal interconnects.

Figure 9A:
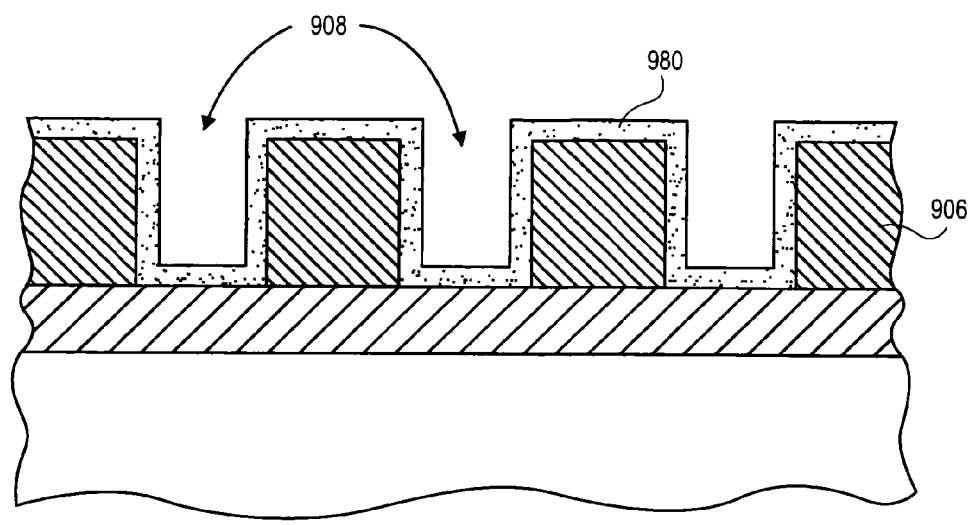
FIGS. 9A-C illustrate cross-sectional views representing preliminary steps in the formation of a plurality of interconnects, in accordance with an embodiment of the present invention.

Referring to FIG. 9A, a Group II element alloy barrier layer 980 is formed conformal to patterned dielectric layer 906. The Group II element alloy barrier layer 980 may be comprised of any Group II element and metal species combination that forms an alloy suitable to inhibit metal line diffusion and/or decrease electro-migration and/or surface chemical reactions, such as oxidation. In accordance with an embodiment of the present invention, the Group II element is selected from the group consisting of beryllium, magnesium, strontium or barium and the metal species is selected from the group consisting of copper, silver, zinc, cadmium, nickel, palladium or platinum. In one embodiment, Group II element alloy barrier layer 980 is formed by co-depositing a metal layer comprised of a copper portion and an alloy portion, wherein the alloy portion is comprised of copper and a Group II element. In a specific embodiment, the alloy portion is comprised of copper and a Group II element with an atomic ratio in the range of 0.5-2:1. In another embodiment, the volume ratio of the copper portion to the alloy portion is in the range of 0.8-1.2:1. In one embodiment, the copper portion and the alloy portion are co-deposited with a physical vapor deposition process, wherein the co-deposition is simultaneous and is carried out at a temperature in the range of 0-50 degrees Celsius. In a specific embodiment, the copper portion and the alloy portion are simultaneously co-deposited in a single reaction chamber equipped with both a copper target and an alloy target. In an embodiment, the copper portion and the alloy portion are co-deposited to a thickness in the range of 50-250 Angstroms.

Figure 9B:
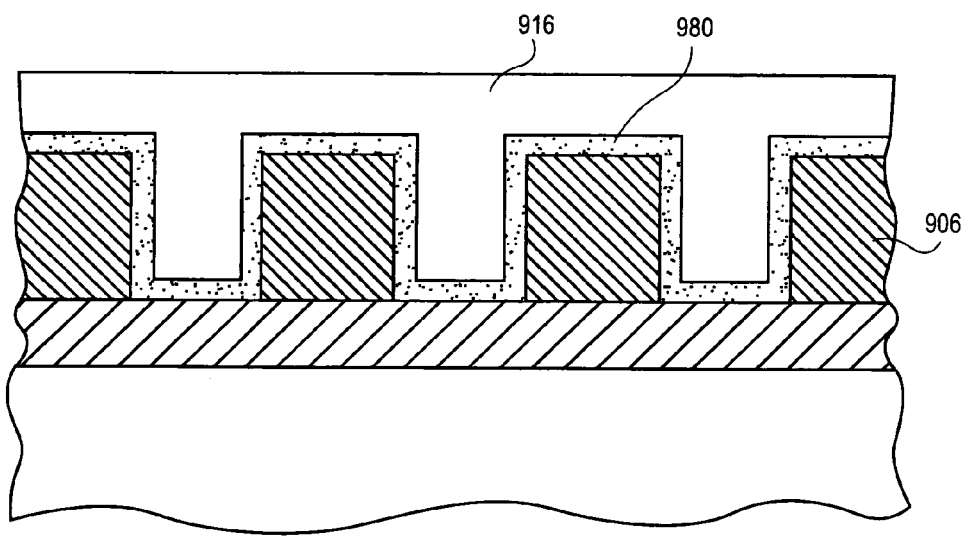

Referring to FIG. 9B, a metal layer 916 is formed above Group II element alloy barrier layer 980. Metal layer 916 may be formed by any process and from any conductive material suitable for completely (or mostly, if a void is inadvertently formed) filling the series of trenches 908. In an embodiment, metal layer 916 is comprised of a material selected from the group consisting of copper, silver, beryllium, aluminum or an alloy thereof. In one embodiment, metal layer 916 comprised of polycrystalline copper with an atomic composition in the range of 97-100% copper atoms. In an embodiment, metal layer 916 is deposited by a technique selected from the group comprising an electro-chemical deposition process, an electro-less deposition process, an atomic layer deposition (ALD) process or a reflow process.

Figure 9C:
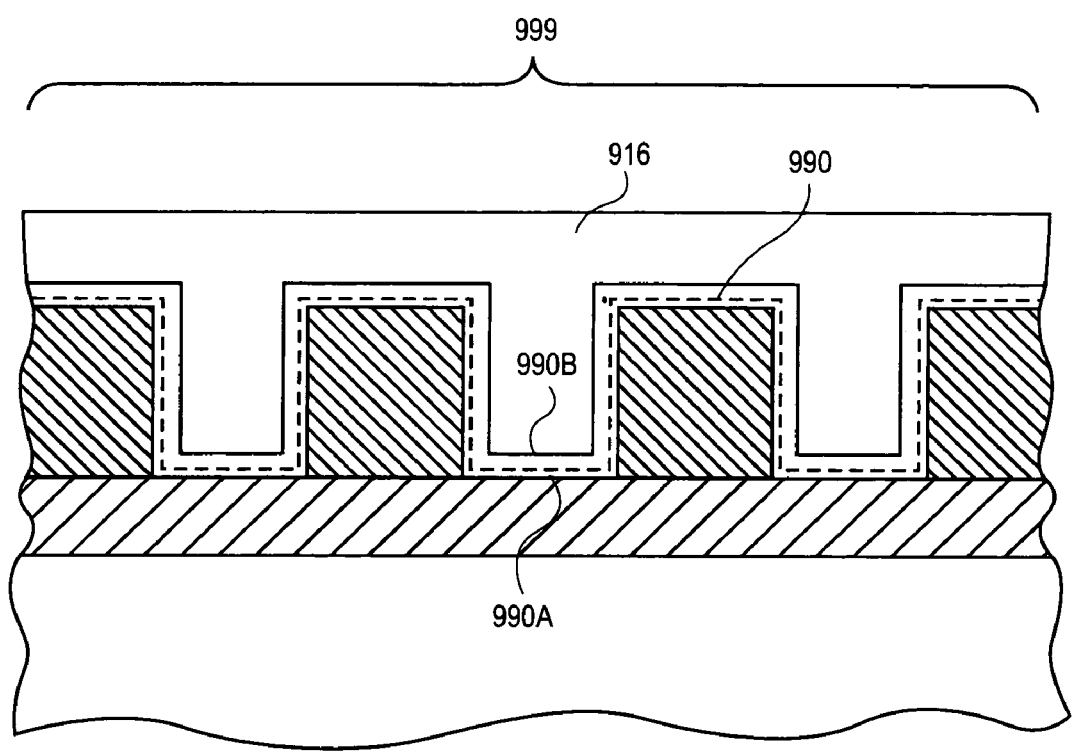

Referring to FIG. 9C, metal layer 916 and Group II element alloy barrier layer 980 are heated to form graded Group II element alloy barrier layer 990 in structure 999, wherein the Group II element has migrated (mass-transferred) to the outer surface of the barrier layer. In accordance with an embodiment of the present invention, heating metal layer 916 and Group II element alloy barrier layer 990 comprises heating in an atmosphere comprising gases selected from the group comprising Ar, He, $H_2$, $N_2$, or 5% $H_2$ in $N_2$ at a temperature in the range of 25-400 degrees Celsius for a duration in the range of 0.5-240 minutes.

Alternatively, it is not necessary that metal layer 916 be present during the heating of Group II element alloy barrier layer 980 to form graded Group II element alloy barrier layer 990. In accordance with an embodiment of the present invention, graded Group II element alloy barrier layer 990 is formed prior to the deposition of metal layer 916. However, care must be taken to not over-heat Group II element alloy barrier layer 980 in the absence of metal layer 916, which otherwise acts as a heat sink during the heating step. Thus, in one embodiment, Group II element alloy barrier layer 980 is heated to form graded Group II element alloy barrier layer 990 in the absence of metal layer 916, wherein the heating is carried out at a temperature in the range of 25-250 degrees Celsius.

The graded Group II element alloy may have a greater concentration of Group II elements at the outer surface 990A of graded Group II element alloy barrier layer 990, as depicted by the dashed lines in element 990 of FIG. 9C. For example, in one embodiment, the atomic ratio of Group II atoms at the outer surface 990A of graded Group II element alloy barrier layer 990 is nearly 1:1 with the metal species and grades down to an atomic ratio in the range of 0.01-0.05:1 at the inner surface 990B of graded Group II element alloy barrier layer 990. In a specific embodiment, graded Group II element alloy barrier layer 990 is comprised of copper and a Group II element with an atomic ratio at the outer surface 990A in the range of 0.5-2:1 and an atomic ratio at the inner surface 990B in the range of 1:0.01-0.05. In one embodiment, graded Group II element alloy barrier layer 990 is deposited to a thickness in the range of 50-250 Angstroms.

Structure 999 from FIG. 9C may be used as a template for the formation of a plurality of metal interconnects comprising a graded barrier layer with a Group II element alloy. Thus, similar processing steps as those described above in association with FIGS. 4-8 may be used to provide a variety of pluralities of metal interconnects. For example, in accordance with one embodiment of the present invention, a patterned dielectric layer is retained to act as an inter-dielectric layer between metal interconnects. In another embodiment, a patterned dielectric layer is removed to form a series of gaps. In one embodiment, the series of gaps is filled with an ultra low-K dielectric layer. In an embodiment, dielectric spacers are formed adjacent to the sidewalls of the metal interconnects. By incorporating a Group II element alloy into graded alloy, a reduced line resistance for the metal interconnects in a plurality of metal interconnects may be achieved.

In addition to imparting a decreased line resistance and an increased mechanical integrity to the plurality of metal interconnects, graded Group II element alloy barrier layer 990 may also impart a greater chemical integrity to the metal interconnects. For example, in accordance with one embodiment of the present invention, by incorporating graded Group II element metal alloy barrier layer 990 at the surfaces (in particular, the sidewalls and bottom surface) of a plurality of metal interconnects, a barrier to metal diffusion is formed. Additionally, a plurality of metal interconnects incorporating graded Group II element alloy barrier layer 990 may be more amenable to process schemes that expose the metal interconnects to atmospheric conditions, such as process schemes that include the formation of a series of gaps or dielectric spacers. Thus, in accordance with an embodiment of the present invention, the Group II element reacts with oxygen atoms to form a robust, yet very thin passivation layer that inhibits deep oxygen penetration into a metal interconnect. In a specific embodiment, a copper-beryllium alloy graded barrier layer 990 inhibits oxidation deeper than the first 2-10 monolayers of the copper-beryllium alloy barrier layer 990.

Although the foregoing embodiments contemplate Group II element alloys for metal interconnects, the present invention is not limited to the use of metal interconnects. Conductive carbon nanotubes may be bundled together and used as interconnects to incorporate electronic or semiconducting devices into an integrated circuit. In accordance with another embodiment of the present invention, a group II element alloy is used as a barrier layer or a seed layer in conjunction with interconnects based on conductive carbon nanotubes. Also, the foregoing embodiments contemplate Group II element alloys formed from a single Group II element species. However, in an additional embodiment, a Group II element alloy comprised of more than one species of Group II elements is used in conjunction with metal or carbon nanotube-based interconnects.

Thus, a plurality of metal interconnects incorporating a Group II element alloy for protecting the metal interconnects and methods to form and incorporate the Group II element alloy have been described. In one embodiment, a Group II element alloy is used as a seed layer, or a portion thereof, which decreases the line resistance and increases the mechanical strength of a metal interconnect. In another embodiment, a Group II element alloy is used to form a barrier layer, which, in addition to decreasing the line resistance and increasing the mechanical integrity, also increases the chemical integrity of a metal interconnect.

What is claimed is:

1. A method for making an electronic structure with a plurality of interconnects, comprising:
    forming a first dielectric layer above a substrate;
    forming a second dielectric layer above said first dielectric layer;
    forming a series of trenches in said second dielectric layer to expose a portion of said first dielectric layer;
    depositing a barrier layer that partially fills said series of trenches, wherein said barrier layer is adjacent to the sidewalls and above the bottoms of said series of trenches;
    depositing a seed layer above said barrier layer, wherein said seed layer is comprised of a metal species and a Group II element;
    forming a metal layer above said seed layer, wherein said metal layer completely fills the remaining portions of said series of trenches;
    removing said second dielectric layer to provide a series of free-standing metal interconnects; and
    forming a third dielectric layer above the top surfaces of said series of interconnects, wherein the regions between said first dielectric layer, said second dielectric layer and said series of metal interconnects defines a series of gaps.

2. The method of claim 1, wherein said Group II element is selected from the group consisting of beryllium, magnesium, strontium or barium, and wherein said metal species is selected from the group consisting of copper, aluminum, silver, zinc, cadmium, nickel, palladium or platinum.

3. The method of claim 2, wherein the concentration of said Group II element is in the range of 0.5-2% of the total weight of said seed layer, and wherein said metal species is copper.

4. The method of claim 3, wherein the resistivity of said seed layer is in the range of 3-9 µOhm·cm.

5. The method of claim 1, wherein said seed layer is deposited by a physical vapor deposition process carried out at a temperature in the range of 0-100 degrees Celsius.

6. The method of claim 5, wherein said seed layer is deposited to a thickness in the range of 50-250 Angstroms.

7. The method of claim 1, further comprising:
   forming a fourth dielectric layer to fill said series of gaps, wherein said fourth dielectric layer comprises an ultra low-K dielectric layer.

8. The method of claim 1, wherein removing said second dielectric layer comprises a wet etch process step, wherein said wet etch process step comprises applying an aqueous solution with a concentration of tetramethylammonium hydroxide in the range of 15-30% by volume at a temperature in the range of 45-70 degrees Celsius for a duration in the range of 15-45 minutes.

* * * * *